US012812876B2

(12) United States Patent
Lai et al.

(10) Patent No.: US 12,812,876 B2
(45) Date of Patent: Nov. 24, 2026

(54) SEMICONDUCTOR DEVICE

(71) Applicant: MACRONIX INTERNATIONAL CO., LTD., Hsinchu (TW)

(72) Inventors: Erh-Kun Lai, Taichung City (TW); Hsiang-Lan Lung, Kaohsiung City (TW); Wei-Chih Chien, Hsinchu City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 582 days.

(21) Appl. No.: 18/464,326

(22) Filed: Sep. 11, 2023

(65) Prior Publication Data

US 2025/0089268 A1 Mar. 13, 2025

(51) Int. Cl.
*H10B 63/00* (2023.01)
*H10N 70/00* (2023.01)

(52) U.S. Cl.
CPC ........... *H10B 63/24* (2023.02); *H10B 63/845* (2023.02); *H10N 70/021* (2023.02); *H10N 70/841* (2023.02)

(58) Field of Classification Search
CPC ... H10N 70/021; H10N 70/841; H10B 63/845
See application file for complete search history.

(56) References Cited

U.S. PATENT DOCUMENTS 10,497,752 B1 12/2019 Ando
10,797,107 B2 10/2020 Wu
11,647,682 B2 5/2023 Lin et al.
2010/0270529 A1 10/2010 Lung
2018/0277596 A1 9/2018 Mori
2022/0028930 A1 1/2022 Wu et al.
2022/0093861 A1 3/2022 Givens et al.
2024/0215241 A1 6/2024 Xiao
2025/0089268 A1* 3/2025 Lai ........................ H10N 70/021

FOREIGN PATENT DOCUMENTS

CN 104871313 A 8/2015
CN 108040501 A 5/2018
CN 111373533 A 7/2020
CN 113437070 A 9/2021
TW 201937770 A 9/2019
TW 202111926 A 3/2021
TW 202212605 A 4/2022
TW 202245248 A 11/2022

* cited by examiner

*Primary Examiner* — Mark V Prenty

(74) *Attorney, Agent, or Firm* — McClure, Qualey & Rodack, LLP

(57) ABSTRACT

A semiconductor device includes a stack including a plurality of insulating layers and a plurality of word plane conductors alternately arranged, a vertical pillar structure disposed in the stack, and a plurality of outer electrodes. The vertical pillar structure includes a conductive core, an inner electrode on a sidewall of the conductive core, and an ovonic threshold switch (OTS) layer on a sidewall of the inner electrode, in which the inner electrode is disposed between the conductive core and the OTS layer. The outer electrodes are disposed between the OTS layer and the word plane conductors, wherein a resistance of a material of the word plane conductors is less than a resistance of a material of the outer electrodes. A method of forming the semiconductor device is also disclosed.

19 Claims, 13 Drawing Sheets

SEMICONDUCTOR DEVICE

BACKGROUND

Field of Invention

The present disclosure relates to a semiconductor device and a method of forming the same.

Description of Related Art

In recent years, the structures of semiconductor devices have been changed constantly, and the storage capacity of the devices has been increased continuously. Memory devices are used in storage elements for many products such as digital cameras, mobile phones, computers, etc. As the application increases, the demand for the memory device focuses on small size and large memory capacity. For satisfying the requirement, a memory device having a high element density and a small size and the manufacturing method thereof are in need.

In order to increase a storage capacity of the memory in a limited memory volume, a three dimensional (3D) memory is developed. In some 3D memory technologies, vertical channel structures may be disposed in blocks arranged in rows. For each block, a plurality of horizontal word lines is formed by stacking planar conductive layers that intersect with the vertical channel structures in the block, forming so-called gate-all-around memory cells.

SUMMARY

An aspect of the disclosure provides a semiconductor device. The semiconductor device includes a stack including a plurality of insulating layers and a plurality of word plane conductors alternately arranged, a vertical pillar structure disposed in the stack, and a plurality of outer electrodes. The vertical pillar structure includes a conductive core, an inner electrode on a sidewall of the conductive core, and an ovonic threshold switch (OTS) layer on a sidewall of the inner electrode, in which the inner electrode is disposed between the conductive core and the OTS layer. The outer electrodes are disposed between the OTS layer and the word plane conductors, wherein a resistance of a material of the word plane conductors is less than a resistance of a material of the outer electrodes.

In some embodiments of the disclosure, the outer electrodes are directly in contact with the OTS layer and the word plane conductors.

In some embodiments of the disclosure, the material of the outer electrodes includes TIN, carbon, graphene, doped carbon, WN, TaN, or W.

In some embodiments of the disclosure, the material of the word plane conductors includes TIN, W, Al, Cu, TaN, Ru, Co, WN, or combinations thereof.

In some embodiments of the disclosure, a resistance of a material of the conductive core is less than a resistance of a material of the inner electrode.

In some embodiments of the disclosure, the material of the inner electrode includes TiN, carbon, graphene, doped carbon, WN, TaN, or W.

In some embodiments of the disclosure, the material of the conductive core includes TIN, W, AI, Cu, TaN, Ru, Co, WN, or combinations thereof.

In some embodiments of the disclosure, the inner electrode is continuously disposed on the sidewall and a bottom surface of the conductive core, and the OTS layer is continuously disposed on the sidewall and a bottom surface of the inner electrode.

In some embodiments of the disclosure, a plurality of sidewalls of the insulating layers are directly in contact with the OTS layer.

In some embodiments of the disclosure, a plurality of sidewalls of the insulating layers align with a plurality of sidewalls of the outer electrodes.

In some embodiments of the disclosure, the inner electrode is continuously disposed on the sidewall and a bottom surface of the conductive core, the OTS layer includes a plurality of OTS segments disposed on the sidewall of the inner electrode, and the OTS segments are spaced apart by the insulating layers.

In some embodiments of the disclosure, a plurality of sidewalls of the insulating layers are directly in contact with the inner electrode.

In some embodiments of the disclosure, a plurality of sidewalls of the insulating layers align with a plurality of sidewalls of the OTS segments.

In some embodiments of the disclosure, the outer electrodes are physically and electrically separated from each other by the insulating layers.

Another aspect of the disclosure provides a method of forming a semiconductor device. The method includes following steps. A stack includes a plurality of insulating layers and a plurality of word plane conductors alternately arranged is formed. A vertical pillar structure is formed in the stack, in which the vertical pillar structure includes a conductive core, an inner electrode on a sidewall of the conductive core, and an ovonic threshold switch (OTS) layer on a sidewall of the inner electrode, in which the inner electrode is disposed between the conductive core and the OTS layer. A plurality of outer electrodes are formed disposed between the OTS layer and the word plane conductors, wherein a resistance of a material of the word plane conductors is less than a resistance of a material of the outer electrodes.

In some embodiments of the disclosure, the step of forming a stack including a plurality of insulating layers and a plurality of word plane conductors alternately arranged includes forming a stack including the insulating layers and a plurality of sacrificial layers alternately arranged; and replacing the sacrificial layers with the word plane conductors.

In some embodiments of the disclosure, the step of forming a plurality of outer electrodes disposed between the OTS layer and the word plane conductors includes recessing the word plane conductors such that a plurality of side surfaces of the word plane conductors are recessed from a plurality of side surfaces of the insulating layers; depositing an electrode material on the side surfaces of the word plane conductors and on the side surfaces of the insulating layers; and removing protruding portions of the electrode material, wherein remaining portions of the electrode material are the outer electrodes, and a plurality of side surfaces of the outer electrodes align with the side surfaces of the insulating layers.

In some embodiments of the disclosure, the method further includes recessing the outer electrodes from the insulating layers, wherein the OTS layer includes a plurality of OTS segments filled between the outer electrodes and the inner electrode, and the OTS segments are spaced apart by the insulating layers.

In some embodiments of the disclosure, the step of forming a vertical pillar structure in the stack includes forming a hole in the stack; forming the OTS layer in the hole and directly in contact with the outer electrodes; forming the inner electrode on the OTS layer; and completely filling the hole with the conductive core.

In some embodiments of the disclosure, a resistance of a material of the conductive core is less than a resistance of a material of the inner electrode.

The semiconductor device of the disclosure is an OTS type memory device requiring set/reset currents to flow between the vertical pillar structures and the word plane. The material of the inner and outer electrodes adjacent the OTS layer is selected to provide good interface performance, and the material of conductive cores of the vertical pillar structures and the word plane conductor is selected to provide low resistance. Therefore, the performance of the semiconductor device can be improved.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
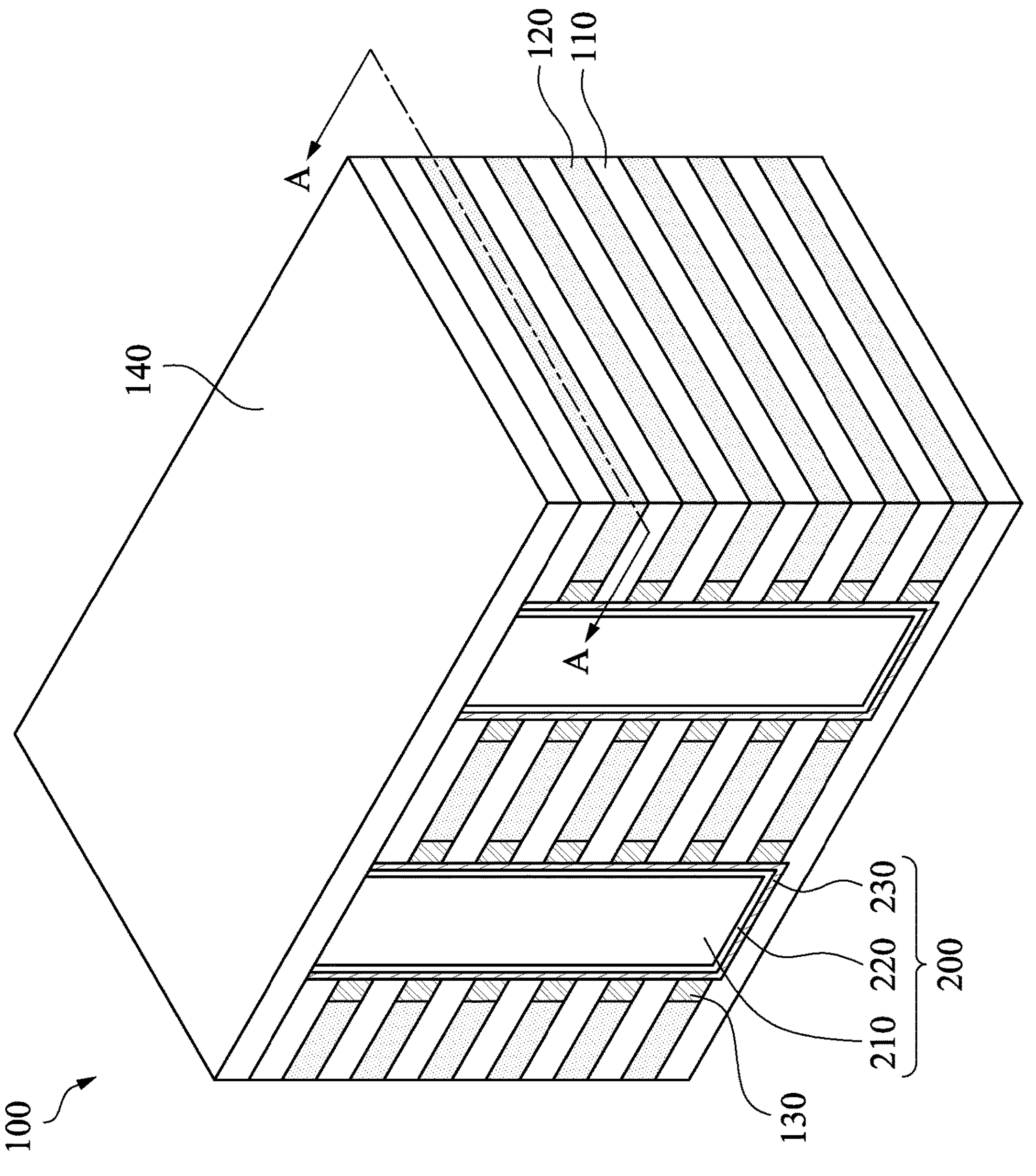
FIG. 1 is an oblique view of a semiconductor device according to some embodiments of the disclosure.

Reference will now be made in detail to the present embodiments of the invention, examples of which are illustrated in the accompanying drawings. Wherever possible, the same reference numbers are used in the drawings and the description to refer to the same or like parts.

Figure 2:
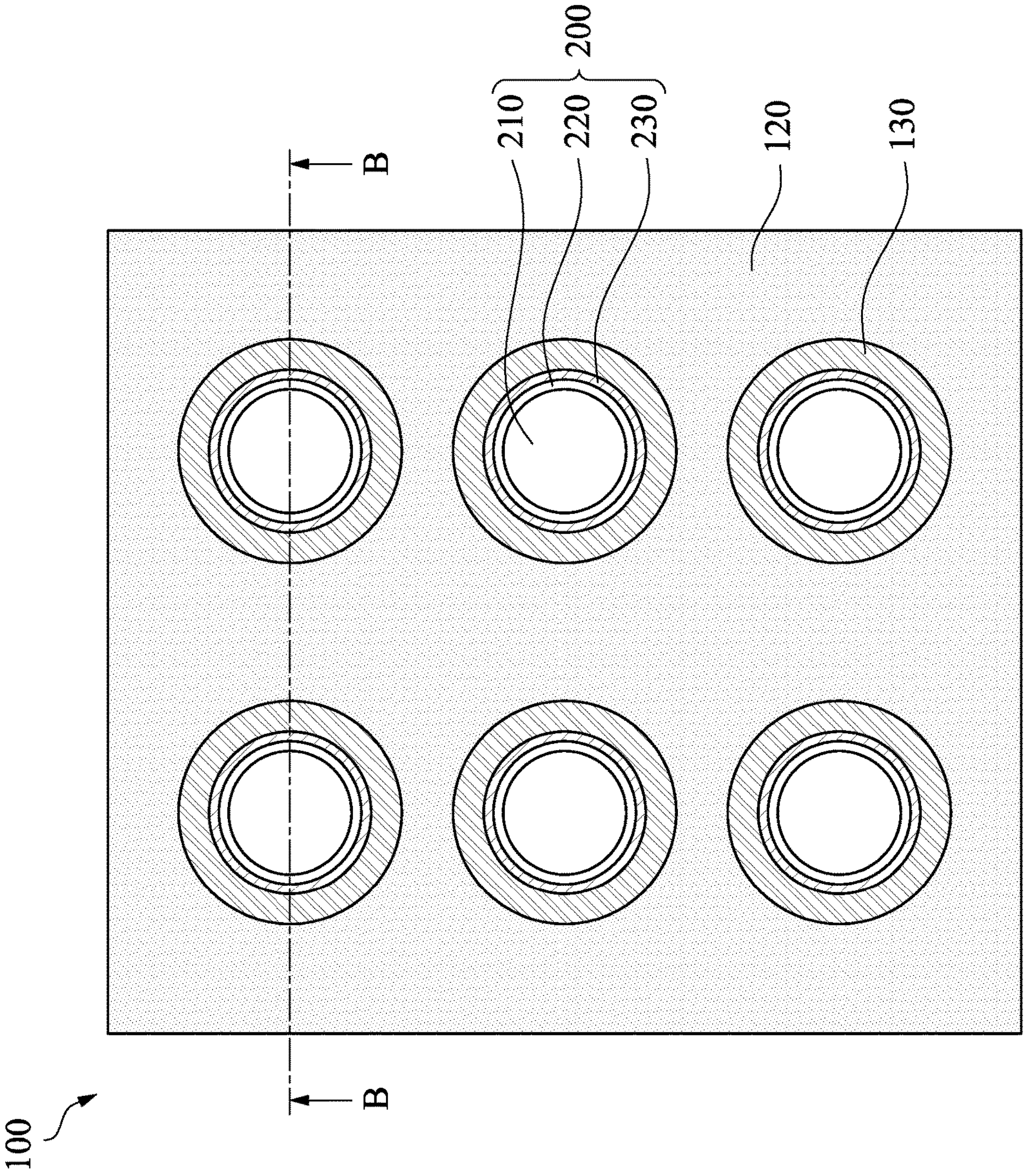
FIG. 2 is a top view taken along plane A-A in FIG. 1.
Figure 3:
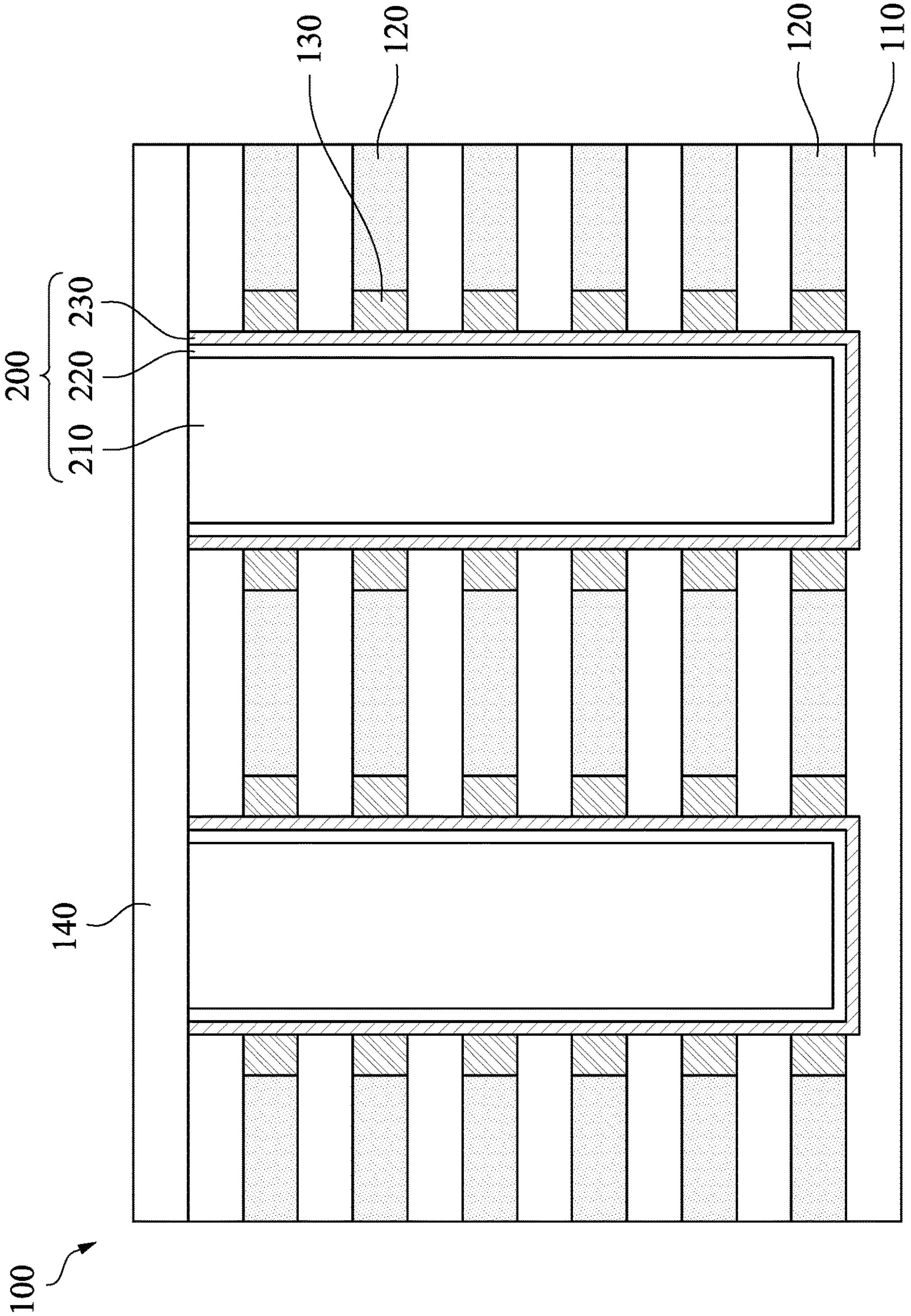
FIG. 3 is a cross-sectional view taken along plane B-B in FIG. 2.

Reference is made to FIG. 1 to FIG. 3, in which FIG. 1 is an oblique view of a semiconductor device according to some embodiments of the disclosure; FIG. 2 is a top view taken along plane A-A in FIG. 1; and FIG. 3 is a cross-sectional view taken along plane B-B in FIG. 2. The semiconductor device 100 of some embodiments of the disclosure relates to gate-all-around memory cells, especially to ovonic threshold switch (OTS) memory cells. The semiconductor device 100 includes a plurality of insulating layers 110 and a plurality of word plane conductors 120 alternately arranged as a stack on a substrate, a plurality of vertical pillar structures 200 penetrating the stack of the insulating layers 110 and the word plane conductors 120, and a plurality of outer electrodes 130 disposed between the vertical pillar structures 200 and the word plane conductors 120. The semiconductor device 100 further includes a cap layer 140 disposed on the topmost insulating layer 110 and on the top surface of the vertical pillar structures 200.

Each of the vertical pillar structures 200 includes a conductive core 210, an inner electrode 220 wrapping a sidewall and a bottom surface of the conductive core 210, and an ovonic threshold switch (OTS) layer 230 wrapping a sidewall and a bottom surface of the inner electrode 220, in which the inner electrode 220 is disposed between the conductive core 210 and the OTS layer 230. In some embodiments, the conductive core 210 has a circular cross-section in the top view (as shown in FIG. 2), and each of the inner electrode 220 and the OTS layer 230 have a ring-shape cross-section in the top view (as shown in FIG. 2). The inner electrode 220 and the OTS layer 230 have U-shape cross-sections in the cross-sectional view (as shown in FIG. 3), respectively.

The outer electrodes 130 are disposed at the same level (e.g. the same word plane) of the word plane conductors 120, respectively. Namely, each of the word plane conductors 120 and the corresponding outer electrode 130 are sandwiched between the adjacent insulating layers 110. The outer electrodes 130 encircle the sidewall of each of the vertical pillar structures 200, respectively. Each of the outer electrodes 130 has a ring-shape cross-section in the top view (as shown in FIG. 2), and the outer electrodes 130 at different word planes are discrete. Namely, the outer electrodes 130 at different word planes are disconnected from each other and are separated by one of the insulating layers 110. The outer electrodes 130 are directly in contact with the OTS layer 230 of the vertical pillar structures 200.

Preferably, the material of the outer electrodes 130 is different from the material of the word plane conductors 120, and the material of the conductive core 210 is different from the material of the inner electrode 220 such that the electrical characteristic of the outer electrodes 130 is different from the electrical characteristic of the word plane conductors 120, and the electrical characteristic of the conductive core 210 is different from the electrical characteristic of the inner electrode 220.

For example, the word plane conductors 120 have a lower resistance than that of the outer electrodes 130, and the discrete outer electrodes 130 can provide good interface performance between the OTS layer 230 and the word plane conductors 120. Additionally, the conductive core 210 has a lower resistance than that of the inner electrode 220, and the inner electrode 220 can provide good interface performance between OTS layer 230 and the conductive core 210.

The semiconductor device 100 is an OTS type memory device which is a current device requiring set/reset currents to flow between the vertical pillar structures 200 and the word plane conductors 120. The semiconductor device 100 of the present disclosure uses different materials to provide low resistance and to provide good interface performance, respectively. Therefore, the performance of the semiconductor device 100 can be improved.

Figure 4:
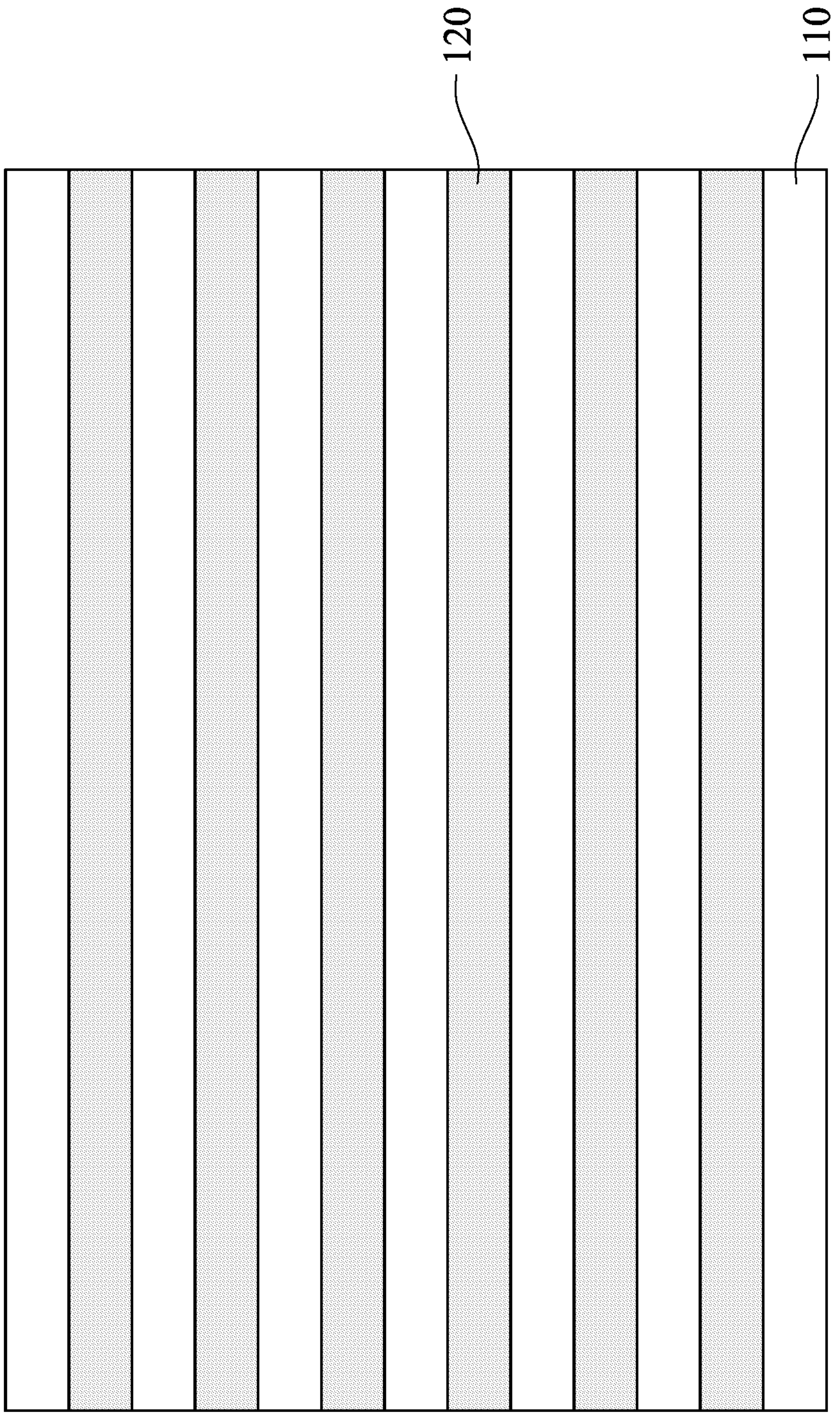
FIG. 4 to FIG. 10 respectively are cross-sectional views of different steps of a method of forming a semiconductor structure according to some embodiments of the disclosure.

Reference is made to FIG. 4 to FIG. 10, in which FIG. 4 to FIG. 10 respectively are cross-sectional views of different steps of a method of forming a semiconductor structure according to some embodiments of the disclosure. As shown in FIG. 4, the method starts at forming a stack of insulating layers 110 and word plane conductors 120. The insulating layers 110 and the word plane conductors 120 are alternately arranged. In some embodiments, the thickness of the insulating layers 110 can be the same or different from the thickness of the word plane conductors 120.

In some embodiments, the stack of the insulating layers 110 and the word plane conductors 120 is formed on a substrate such as a silicon substrate. In some other embodiments, the stack of the insulating layers 110 and the word plane conductors 120 is formed on a substrate having a plurality of semiconductor components, such as a plurality of complementary metal-oxide-semiconductor (CMOS) components and other suitable circuits.

The insulating layers 110 are oxide layers such as silicon oxide layers, and the word plane conductors 120 are made of material having low resistance. For example, the low resistance material of the word plane conductors 120 includes TIN, W, Al, Cu, TaN, Ru, Co, WN, or combinations thereof. The insulating layers 110 and the word plane conductors 120 can be formed by any suitable deposition processes such as by an atomic layer deposition (ALD) process.

Figure 5:
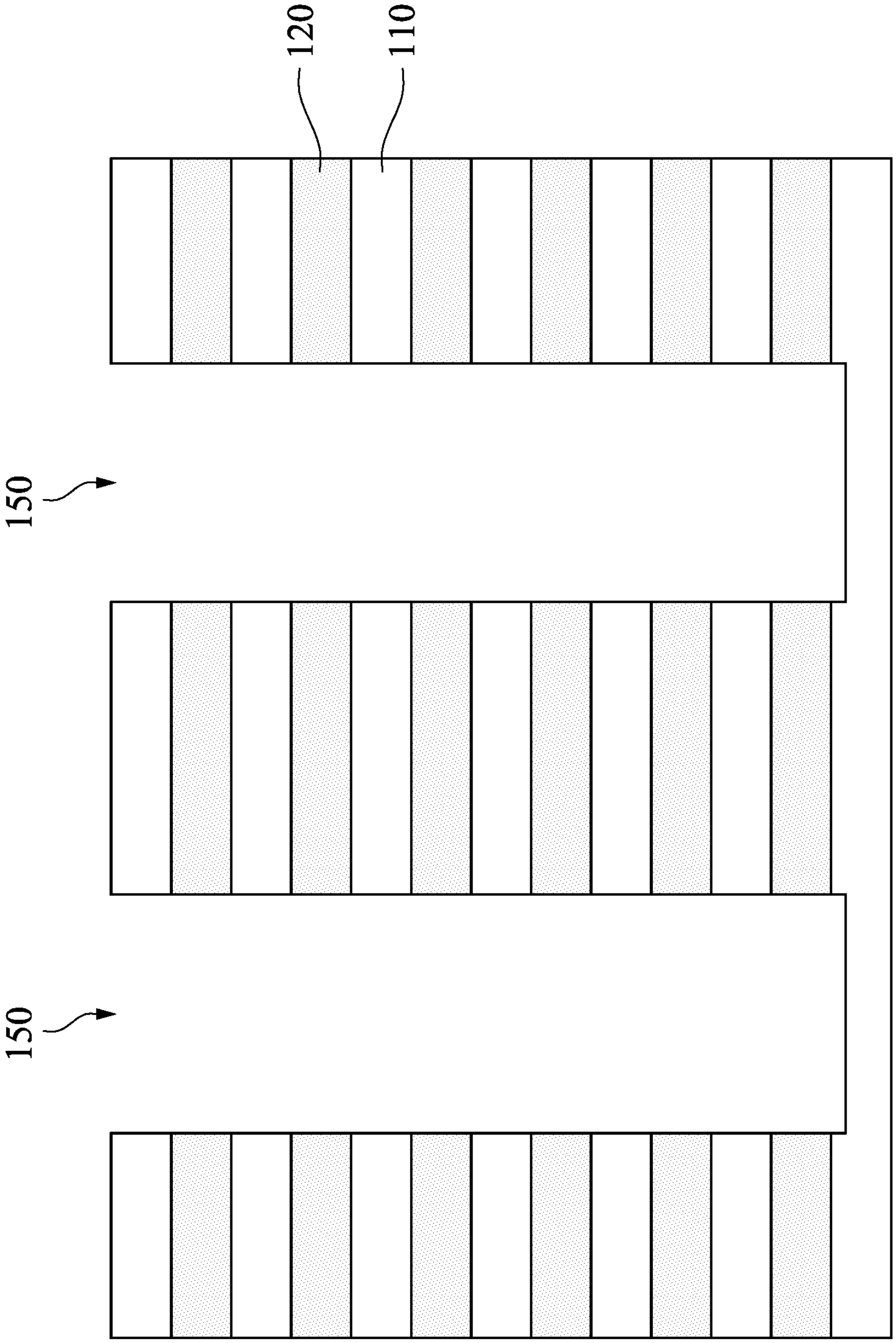

Reference is made to FIG. 5. A plurality of holes 150 are formed in the stack of the insulating layers 110 and the word plane conductors 120. The holes 150 can be formed by an etching process, and the etching process stops at the bottommost insulating layer 110. In some embodiments, a patterned hard mask layer is formed on the stack of the insulating layers 110 and the word plane conductors 120, and portions of the insulating layers 110 and the word plane conductors 120 uncovered by the patterned hard mask layer are removed during the etching process to form the holes 150. The patterned hard mask layer can be removed after the holes 150 are formed. In some embodiments, the bottommost insulating layer 110 may have a thicker thickness such that the holes 150 can be terminated at the bottommost insulating layer 110.

Figure 6:
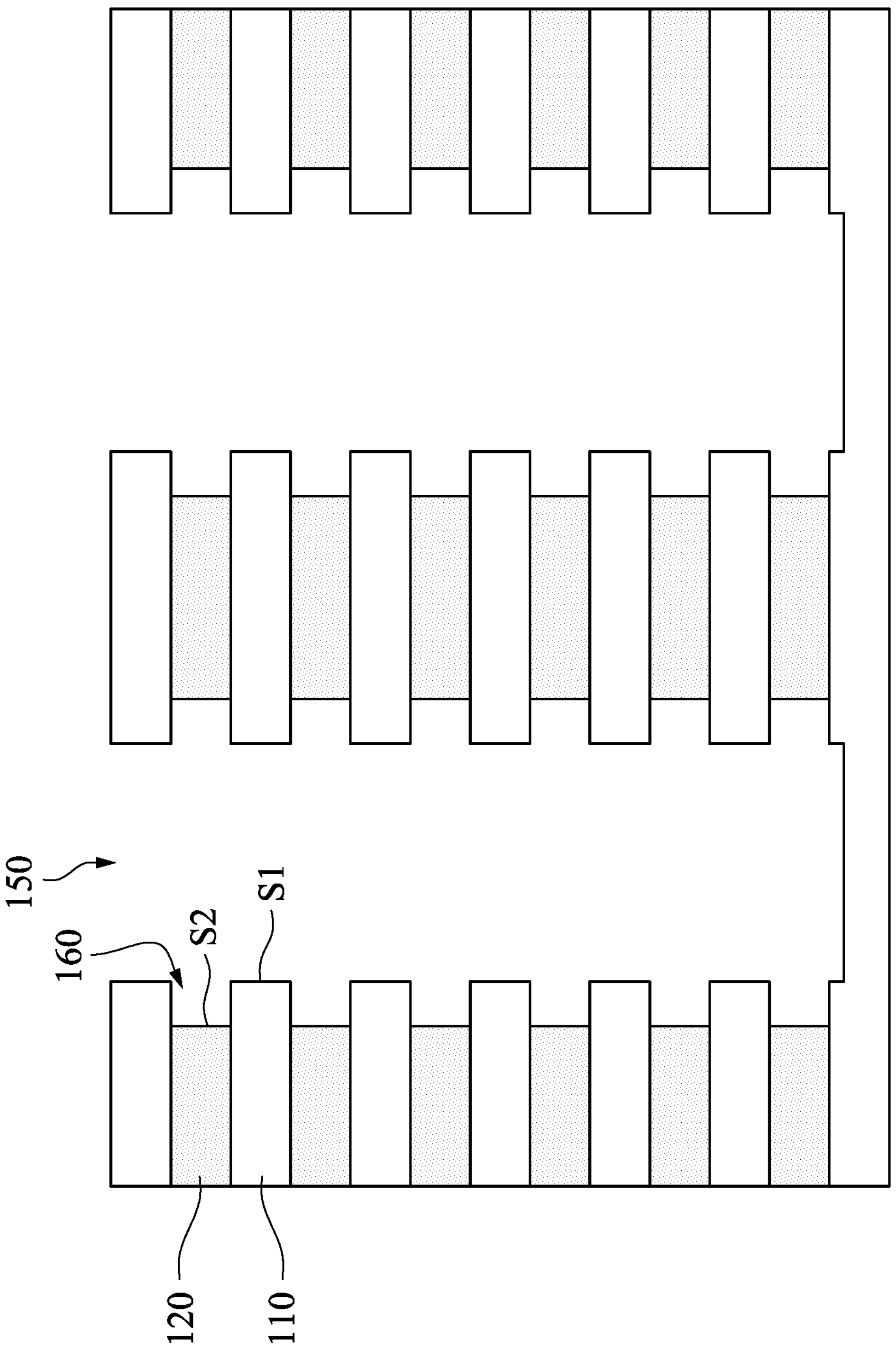

Reference is made to FIG. 6. An etching process is performed to remove portions of the word plane conductors 120 such that the word plane conductors 120 are recessed from the insulating layers 110. More particularly, the etching process has a high etching selectivity between the insulating layers 110 and the word plane conductors 120 which etches the word plane conductors 120 faster than etches the insulating layers 110. As a result, the side surfaces S1 of the insulating layers 110 are laterally protruded from the side surfaces S2 of the word plane conductors 120, and a plurality of cavities 160 are formed between the insulating layers 110. In some embodiments, the side surface S2 of each of the word plane conductors 120 can be a flat surface, a concave surface, or a convex surface, depending on the selected etching process.

Figure 7:
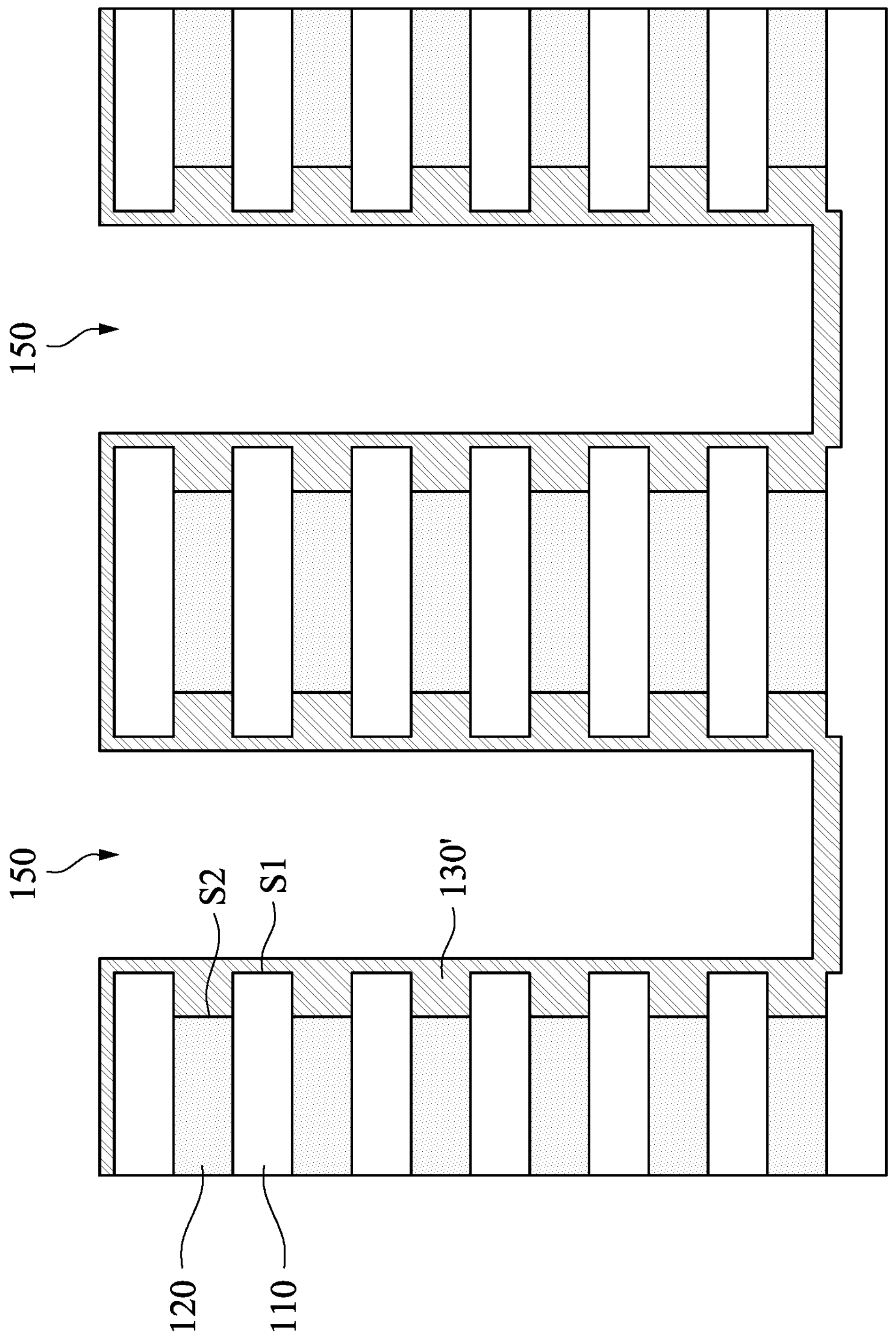

Reference is made to FIG. 7. An electrode material 130' is deposited on the structure of FIG. 6. In some embodiments, the electrode material 130' is conformally deposited on the side surfaces S1 of the insulating layers 110 and the side surfaces S2 of the word plane conductors 120, and the electrode material 130' at least fills the cavities 160 (as shown FIG. 6).

The material of the electrode material 130' is different from the material of the word plane conductors 120. More particularly, the material of the electrode material 130' is also conductive, and the material of the word plane conductors 120 has a resistance less than the material of the electrode material 130'. The material of the electrode material 130' is selected to have good interface performance between the OTS layer and the word plane conductors 120. For example, the material of the electrode material 130' includes TIN, carbon, graphene, doped carbon, WN, TaN, or W.

Figure 8:
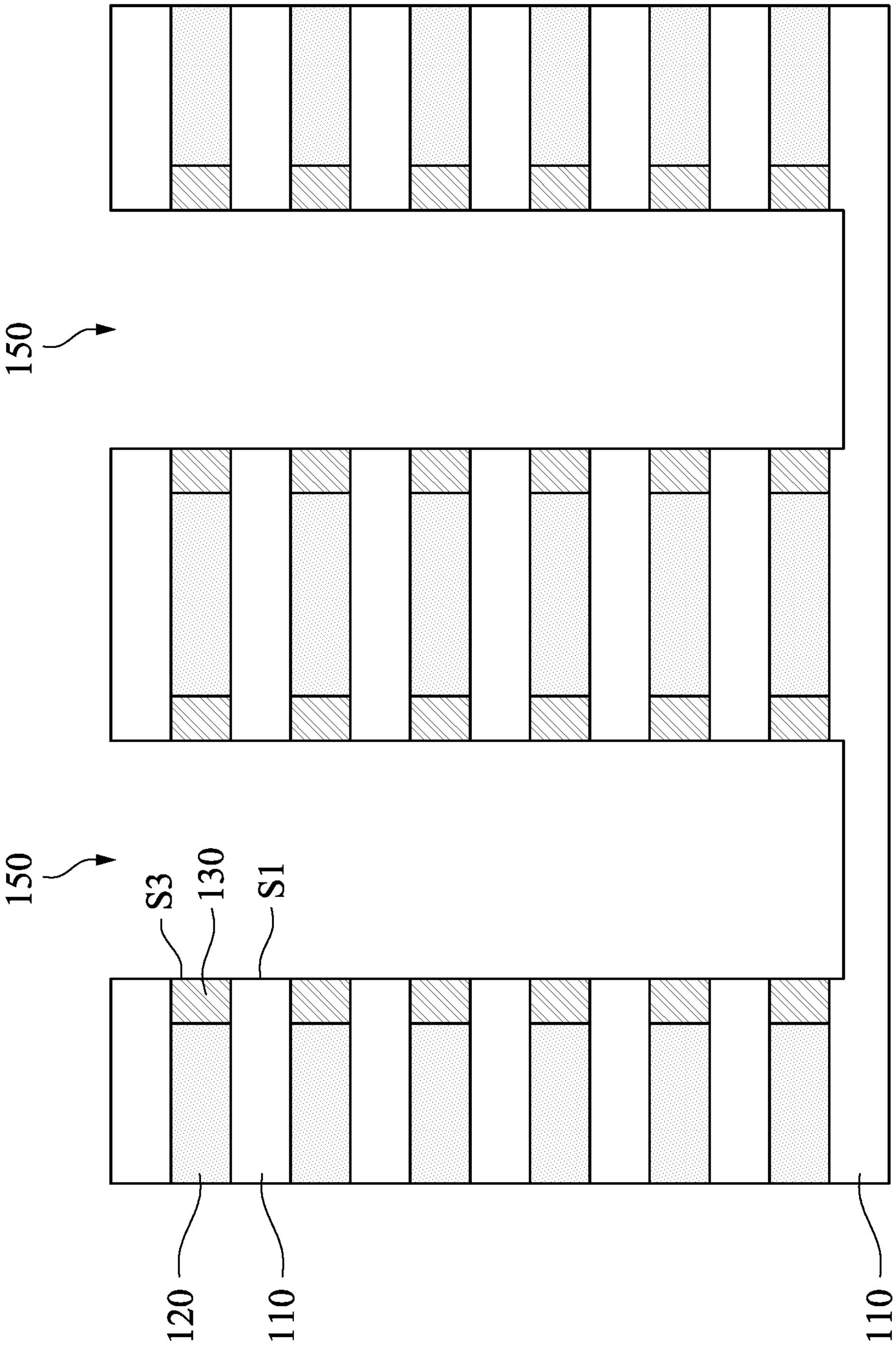

Reference is made to FIG. 8. An etching process is performed to remove protruding portions of the electrode material 130' (as shown in FIG. 7), and the remaining portions of the electrode material 130' are the outer electrodes 130. In some embodiments, the etching process to remove the protruding portions of the electrode material 130' is an anisotropic etching process such as a reactive ion etching (RIE) process, and portions of the insulating layers 110 are also removed after the etching process.

After the etching process, the outer electrodes 130 are formed only in the cavities 160 (as shown FIG. 6) of the recessed word plane conductors 120, and the side surfaces S1 of the insulating layers 110 align with side surfaces S3 of the outer electrodes 130. After the etching process of removing the electrode material 130', the bottommost insulating layer 110 is exposed by the holes 150 again.

Figure 9:
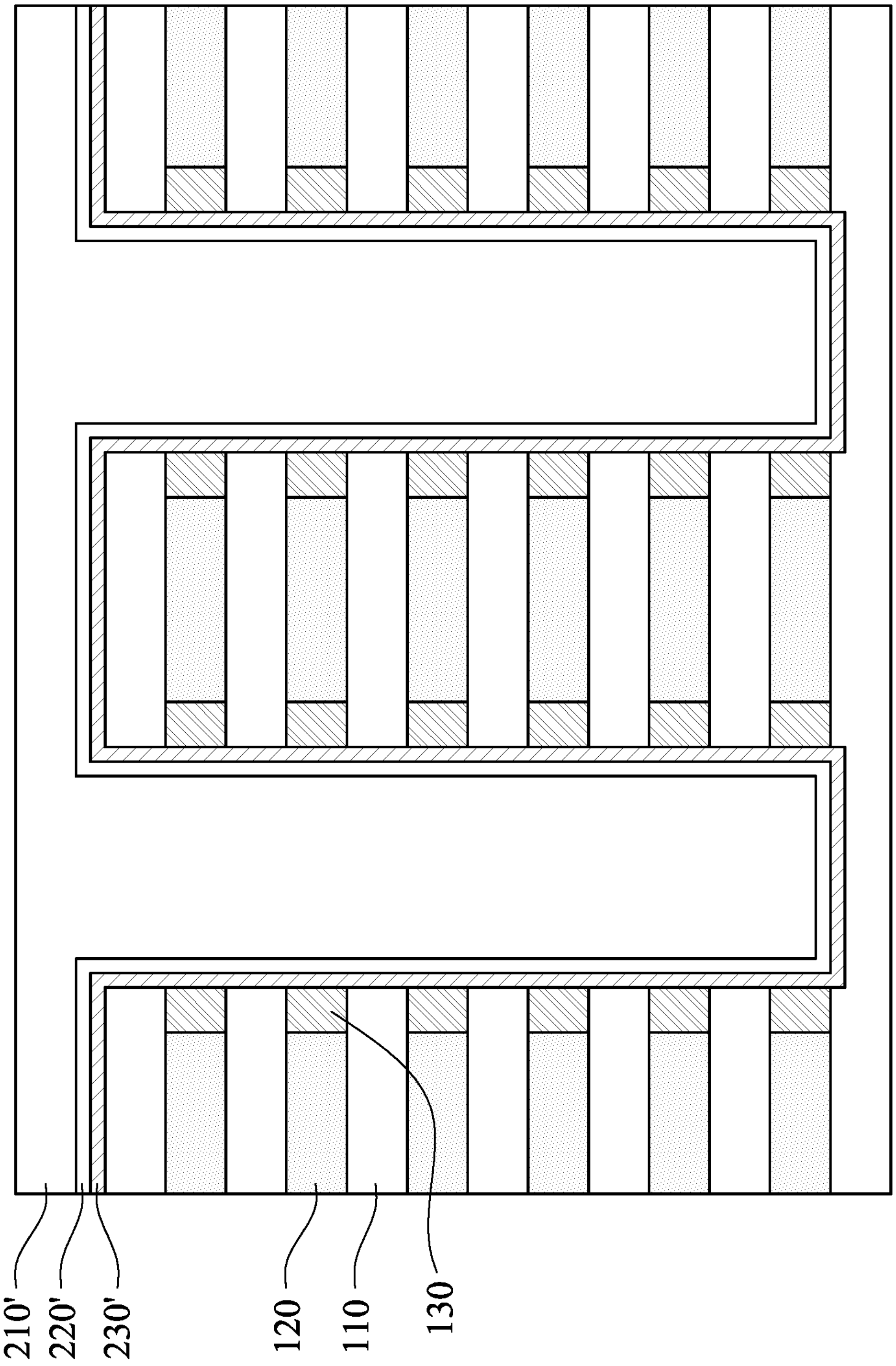

Reference is made to FIG. 9. An OTS material 230' is conformally deposited on the sidewalls of the holes 150 (as shown in FIG. 8), and then an additional electrode material 220' is conformally deposited on the OTS material 230'. A conductive material 210' is further deposited to fill the holes 150. In some embodiments, the holes 150 are completely filled by the conductive material 210', without any seam therein.

The material of the OTS material 230' includes chalcogenide material selected for use as an ovonic threshold switch, such as $As_2Se_3$, ZnTe, or GeSe. In some embodiments, the material of the OTS material 230' can include a chalcogenide in combination with one or more elements from the group consisting of Te, Se, Ge, Si, As, Ti, S, Sb, and combinations thereof.

The material of the additional electrode material 220' is different from the material of the conductive material 210'. More particularly, the material of the additional electrode material 220' is also conductive, and the material of the conductive material 210' has a resistance less than the material of the additional electrode material 220'.

For example, the material of the conductive material 210' includes TIN, W, Al, Cu, TaN, Ru, Co, WN, or combinations thereof. The material of the additional electrode material 220' is selected to have good interface performance between the OTS material 230' and the conductive material 210'. For example, the material of the additional electrode material 220' includes TiN, carbon, graphene, doped carbon, WN, TaN, or W.

Figure 10:
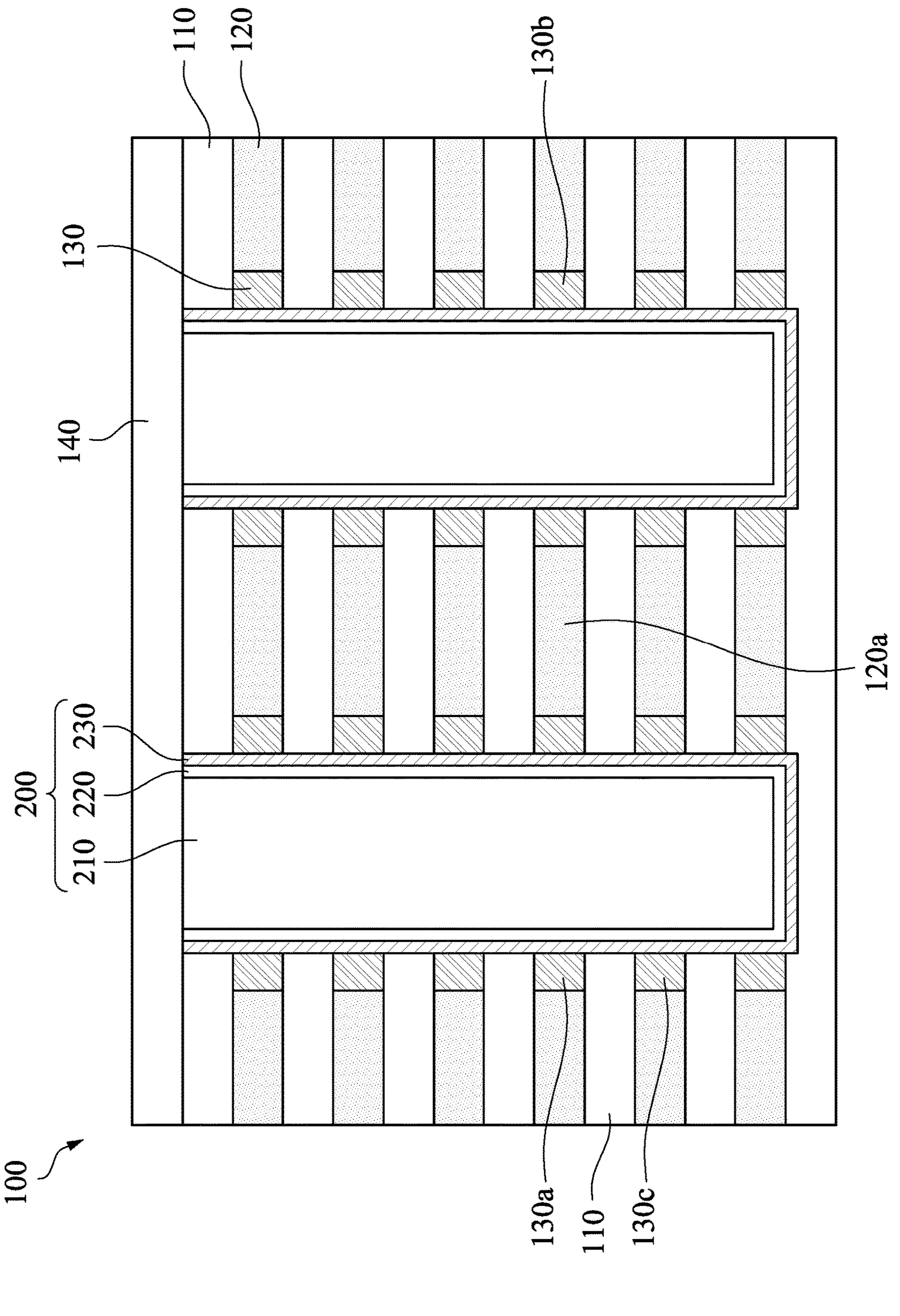

Reference is made to FIG. 10. A planarization process is performed to remove the exceeded portions of the conductive material 210', the additional electrode material 220', and the OTS material 230' (as shown in FIG. 9). The planarization process can be a chemical mechanical polishing (CMP) process and stops at the topmost insulating layer 110. A plurality of vertical pillar structures 200 are defined in the holes after the planarization process is performed. A cap layer 140 is deposited on the vertical pillar structures 200 and the topmost insulating layer 110 to seal the memory array.

Each of the vertical pillar structures 200 includes a conductive core 210, an inner electrode 220 directly in contact with the sidewall and the bottom surface of the conductive core 210, and an OTS layer 230 directly in contact with the sidewall and the bottom surface of the inner electrode 220. The outer electrodes 130 and the word plane conductors 120 together serve as gate structures to the vertical pillar structures 200 thereby forming gate-all-around memory cells.

The materials of the word plane conductors 120 and the conductive cores 210 are selected to provide low resistance, such that the set/reset currents to the semiconductor device 100 can be reduced. The materials of the word plane conductors 120 and the conductive cores 210 include TIN, W, Al, Cu, TaN, Ru, Co, WN, or combinations thereof. In some embodiments, the material of the word plane conductors 120 can be the same as the material of the conductive cores 210. In some embodiments, the material of the word plane conductors 120 can be different from the material of the conductive cores 210.

The materials of the inner electrodes 220 and the outer electrodes 130 are selected to provide good interface performance between the conductive cores 210 and the OTS layers 230 or between the OTS layers 230 and the word plane conductors 120, such that the OTS performance of the semiconductor device 100 can be improved. The materials of the inner electrodes 220 and the outer electrodes 130 include TIN, carbon, graphene, doped carbon, WN, TaN, or W. In some embodiments, the material of the outer electrodes 130 can be the same as the material of the inner electrodes 220. In some embodiments, the material of the outer electrodes 130 can be different from the material of the inner electrodes 220.

As illustrated in FIG. 10, the outer electrodes 130 are discrete. For example, the outer electrode 130*a* and the outer electrode 130*b* at the same word plane are physically spaced apart by the word plane conductors 120*a*. The outer electrode 130*a*, the outer electrode 130*b*, and the word plane conductors 120*a* at the same word plane are electrically connected. Additionally, the outer electrode 130*a* and the outer electrode 130*c* at different word planes are physically and electrically separated by at least one of the insulating layer 110. Each of the outer electrodes 130 is directly in contact with the OTS layer 230 of the corresponding vertical pillar structure 200. Each of the insulating layers 110 is directly in contact with the OTS layer 230 of the corresponding vertical pillar structure 200.

Figure 11:
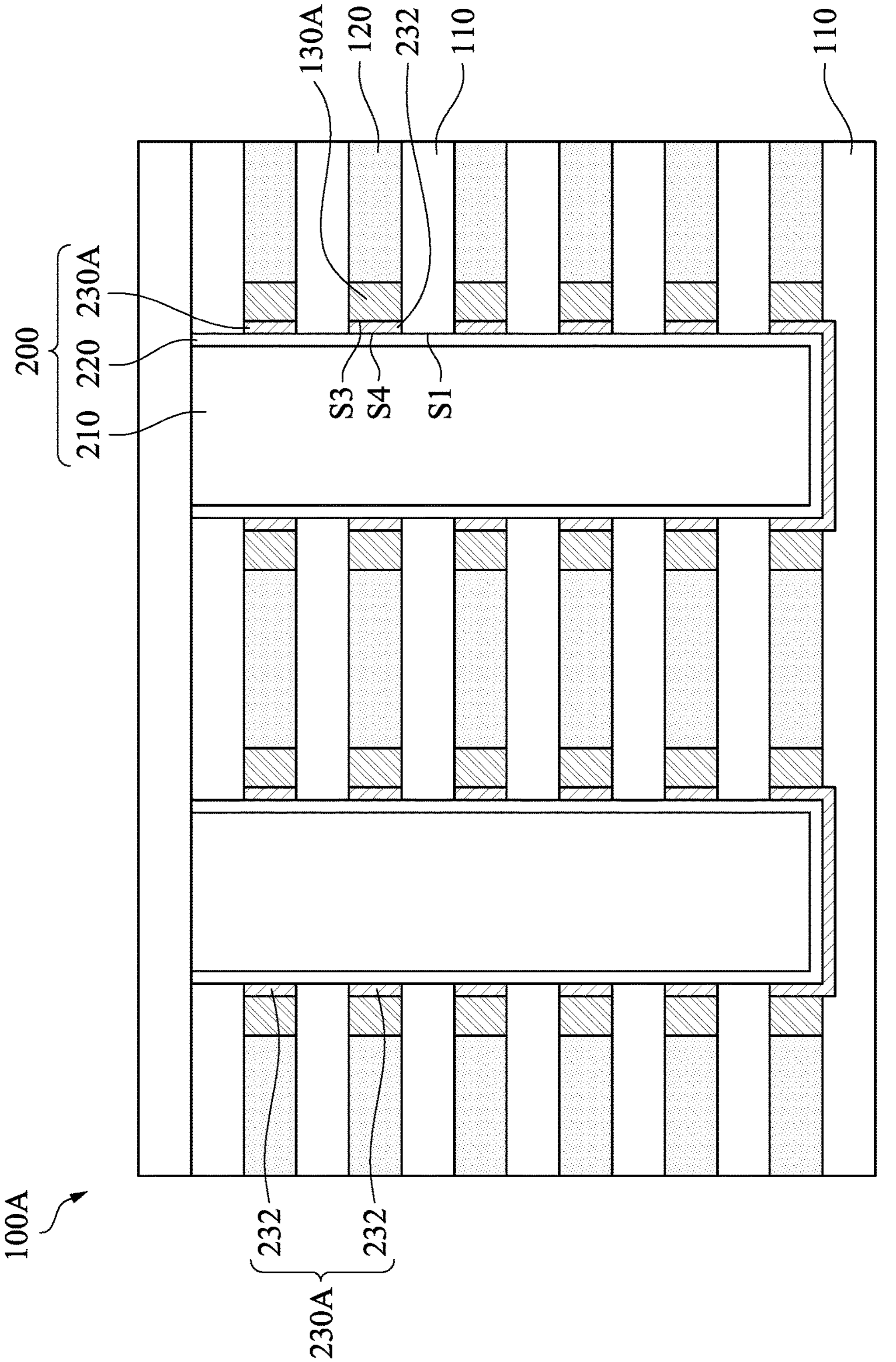
FIG. 11 is a cross-sectional view of a semiconductor device according to some embodiments of the disclosure.

Reference is made to FIG. 11, which is a cross-sectional view of a semiconductor device according to some embodiments of the disclosure. The main difference between the semiconductor device 100A and the semiconductor device 100 is that the OTS layer 230A of each vertical pillar structure 200 of the semiconductor device 100A is divided into a plurality of OTS segments 232. More particularly, the outer electrodes 130A are further recessed from the insulating layers 110, and the OTS segments 232 are filled in the spaces between the insulating layers 110 and the outer electrodes 130A.

The side surfaces S3 of the outer electrodes 130A are recessed from the side surfaces S1 of the insulating layers 110, and the side surfaces S4 of the OTS segments 232 align with the side surfaces S1 of the insulating layers 110. The OTS segments 232 are discrete. The OTS segments 232 at different word planes are physically and electrically separated by at least one of the insulating layer 110. The OTS segments 232 at the same word plane are physically spaced apart by the word plane conductors 120 and the outer electrodes 130A.

The inner electrode 220 is directly and continuously in contact with the sidewall and the bottom surface of the conductive core 210, and the bottom surface of the inner electrode 220 is directly in contact with the bottommost insulating layer 110, without the OTS layer 230A in between. Each of the OTS segments 232 is directly in contact with the inner electrode 220 of the corresponding vertical pillar structure 200. Each of the insulating layers 110 is directly in contact with the inner electrode 220 of the corresponding vertical pillar structure 200.

Figure 12:
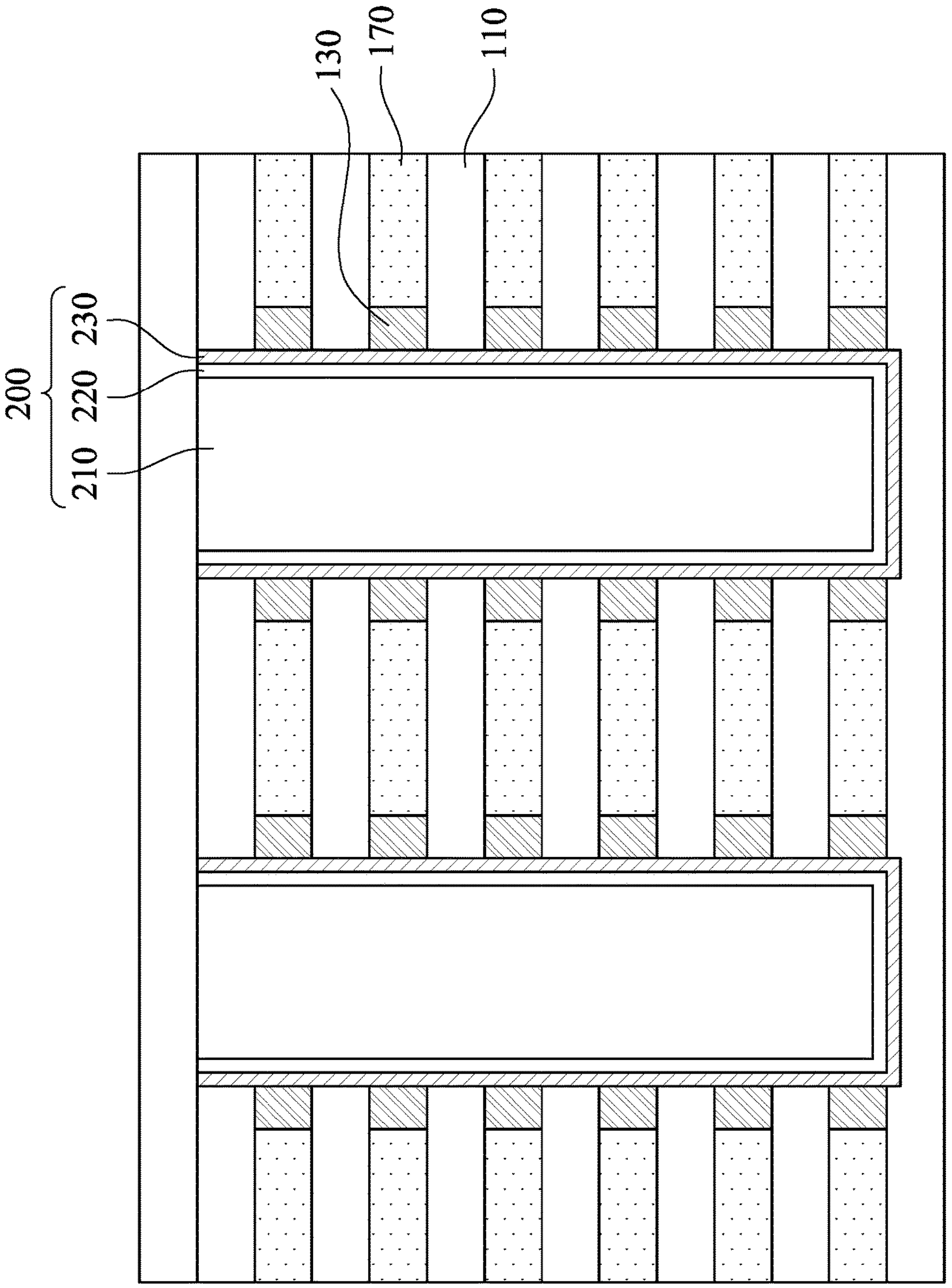
FIG. 12 and FIG. 13 are cross-sectional views of different steps of a method of forming a semiconductor structure according to some embodiments of the disclosure.
Figure 13:
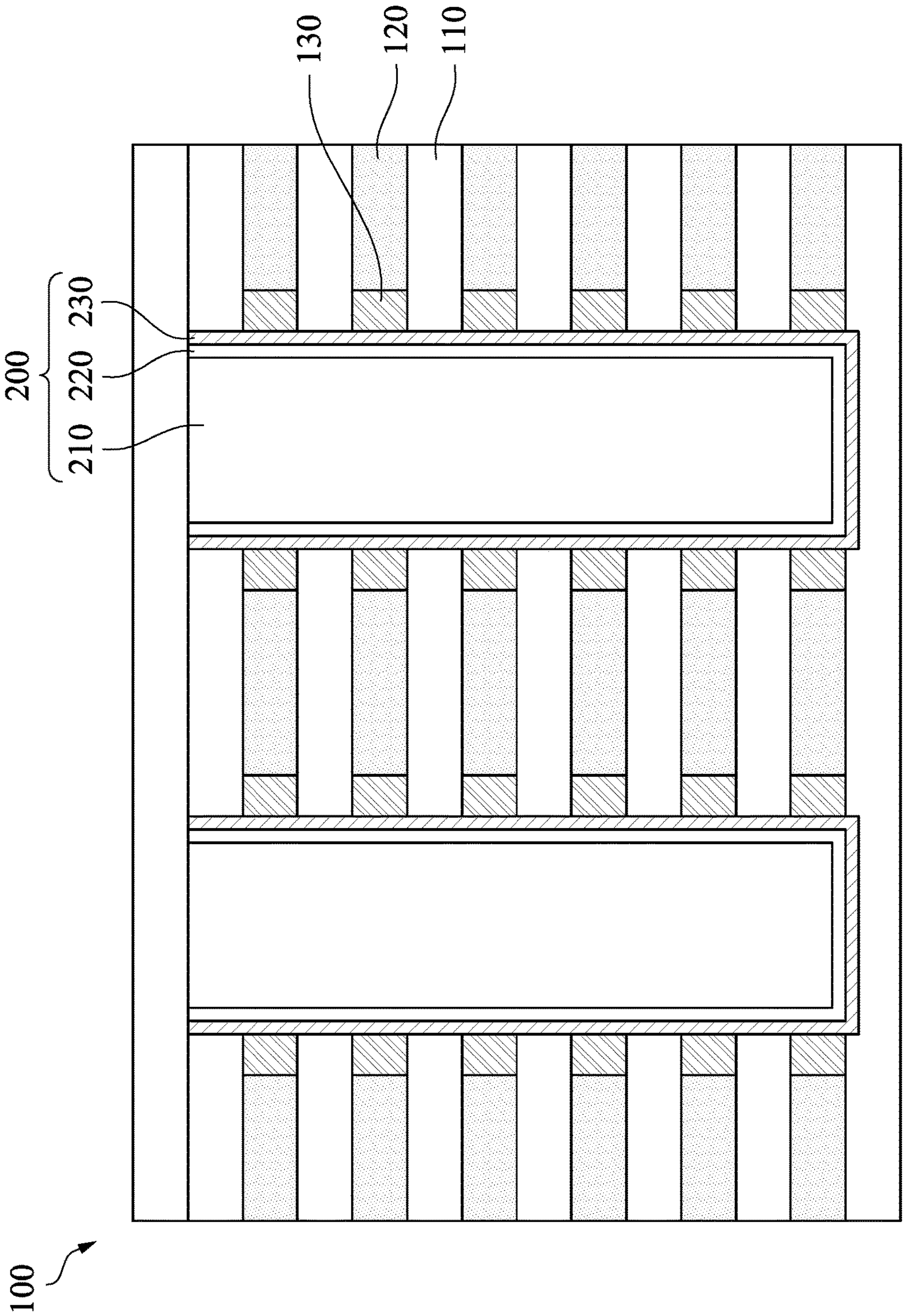

Reference is made to FIG. 12 and FIG. 13. FIG. 12 and FIG. 13 are cross-sectional views of different steps of a method of forming a semiconductor structure according to some embodiments of the disclosure. In some embodiments, the word plane conductors 120 can be formed by a gate replacement process. In the situation that the word plane conductors 120 are formed by the gate replacement process, the stack in FIG. 4 can be a stack of insulating layers 110 and sacrificial layers 170, in which the material of the insulating layers 110 is different from the material of the sacrificial layers 170. For example, the material of the insulating layers 110 can be oxide such as silicon oxide, and the material of the sacrificial layers 170 is nitride such as silicon nitride. The sacrificial layers 170 are further replaced by the word plane conductors 120, as shown in FIG. 13. The process of replacing the sacrificial layers 170 with the word plane conductors 120 is performed after the vertical pillar structures 200 are formed.

The semiconductor device of the disclosure is an OTS type memory device requiring set/reset currents to flow between the vertical pillar structures and the word plane. The material of the inner and outer electrodes adjacent the OTS layer is selected to provide good interface performance, and the material of conductive cores of the vertical pillar structures and the word plane conductor is selected to provide low resistance. Therefore, the performance of the semiconductor device can be improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims and their equivalents.

What is claimed is:

1. A semiconductor device comprising:

a stack comprising a plurality of insulating layers and a plurality of word plane conductors alternately arranged;

a vertical pillar structure disposed in the stack, the vertical pillar structure comprising a conductive core, an inner electrode on a sidewall of the conductive core, and an ovonic threshold switch (OTS) layer on a sidewall of the inner electrode, in which the inner electrode is disposed between the conductive core and the OTS layer; and a plurality of outer electrodes disposed between the OTS layer and the word plane conductors, wherein a resistance of a material of the word plane conductors is less than a resistance of a material of the outer electrodes.

2. The semiconductor device of claim 1, wherein the outer electrodes are directly in contact with the OTS layer and the word plane conductors.

3. The semiconductor device of claim 1, wherein the material of the outer electrodes comprises TiN, carbon, graphene, doped carbon, WN, TaN, or W.

4. The semiconductor device of claim 1, wherein the material of the word plane conductors comprises TIN, W, Al, Cu, TaN, Ru, Co, WN, or combinations thereof.

5. The semiconductor device of claim 1, wherein a resistance of a material of the conductive core is less than a resistance of a material of the inner electrode.

6. The semiconductor device of claim 5, wherein the material of the inner electrode comprises TiN, carbon, graphene, doped carbon, WN, TaN, or W.

7. The semiconductor device of claim 5, wherein the material of the conductive core comprises TIN, W, Al, Cu, TaN, Ru, Co, WN, or combinations thereof.

8. The semiconductor device of claim 1, wherein the inner electrode is continuously disposed on the sidewall and a bottom surface of the conductive core, and the OTS layer is continuously disposed on the sidewall and a bottom surface of the inner electrode.

9. The semiconductor device of claim 8, wherein a plurality of sidewalls of the insulating layers are directly in contact with the OTS layer.

10. The semiconductor device of claim 8, wherein a plurality of sidewalls of the insulating layers align with a plurality of sidewalls of the outer electrodes.

11. The semiconductor device of claim 1, wherein the inner electrode is continuously disposed on the sidewall and a bottom surface of the conductive core, the OTS layer comprises a plurality of OTS segments disposed on the sidewall of the inner electrode, and the OTS segments are spaced apart by the insulating layers.

12. The semiconductor device of claim 11, wherein a plurality of sidewalls of the insulating layers are directly in contact with the inner electrode.

13. The semiconductor device of claim 11, wherein a plurality of sidewalls of the insulating layers align with a plurality of sidewalls of the OTS segments.

14. The semiconductor device of claim 1, wherein the outer electrodes are physically and electrically separated from each other by the insulating layers.

15. The semiconductor device of claim 1, wherein a plurality of sidewalls of the insulating layers and a plurality of sidewalls of the outer electrodes are coplanar.

16. The semiconductor device of claim 1, wherein a bottom surface of the OTS layer is below a bottom surface of a bottommost outer electrode of the plurality of outer electrodes.

17. The semiconductor device of claim 1, further comprising a cap layer disposed on a topmost insulating layer of the plurality of insulating layers and on a top surface of the vertical pillar structure.

18. The semiconductor device of claim 1, wherein a material of the inner electrode is the same as a material of the plurality of outer electrodes.

19. The semiconductor device of claim 1, wherein a material of the inner electrode is different from a material of the plurality of outer electrodes.

* * * * *